(12) United States Patent
Chang et al.

(10) Patent No.: US 8,855,407 B2
(45) Date of Patent: Oct. 7, 2014

(54) ELECTRONIC DEVICE AND METHOD FOR ADJUSTING ORIENTATION OF PRODUCT MODEL IN MACHINE COORDINATE SYSTEM

(75) Inventors: Chih-Kuang Chang, New Taipei (TW); Xin-Yuan Wu, Shenzhen (CN); Wei Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 392 days.

(21) Appl. No.: 13/245,876

(22) Filed: Sep. 27, 2011

(65) Prior Publication Data

US 2012/0182289 A1 Jul. 19, 2012

(30) Foreign Application Priority Data

Jan. 19, 2011 (CN) .......................... 2011 1 0021434

(51) Int. Cl.
| | |
|---|---|
| G06K 9/00 | (2006.01) |
| G06K 9/36 | (2006.01) |
| G06K 9/32 | (2006.01) |
| G01B 7/008 | (2006.01) |
| G01B 5/008 | (2006.01) |
| G06F 17/50 | (2006.01) |

(52) U.S. Cl.
CPC ................ G06F 17/50 (2013.01); G01B 7/008 (2013.01); G01B 5/008 (2013.01)
USPC ............ 382/154; 382/290; 382/293; 382/294

(58) Field of Classification Search
CPC . G06T 2219/2016; G06T 19/00; G06T 17/20; G06T 15/10
USPC .......................................... 382/154, 293, 294
See application file for complete search history.

(56) References Cited

U.S. PATENT DOCUMENTS

| | | | | | |
|---|---|---|---|---|---|
| 5,454,371 | A | * | 10/1995 | Fenster et al. ................ | 600/443 |
| 5,557,714 | A | * | 9/1996 | Lines et al. ................... | 345/653 |
| 6,323,859 | B1 | * | 11/2001 | Gantt ............................ | 345/419 |
| 6,556,705 | B1 | * | 4/2003 | Shalom ........................ | 382/154 |
| 6,573,903 | B2 | * | 6/2003 | Gantt ........................... | 345/619 |
| 6,628,286 | B1 | * | 9/2003 | Comair et al. ............... | 345/473 |
| 6,897,864 | B2 | * | 5/2005 | Sato ............................. | 345/424 |
| 6,999,073 | B1 | * | 2/2006 | Zwern et al. ................. | 345/420 |
| 7,346,408 | B2 | * | 3/2008 | Van Bael et al. ............. | 700/98 |
| 8,169,433 | B2 | * | 5/2012 | Wang et al. .................. | 345/419 |
| 8,326,021 | B2 | * | 12/2012 | Kobayashi et al. .......... | 382/154 |
| 8,379,014 | B2 | * | 2/2013 | Wiedemann et al. ........ | 345/419 |
| 8,401,276 | B1 | * | 3/2013 | Choe et al. ................... | 382/154 |
| 2001/0020946 | A1 | * | 9/2001 | Kawakami et al. .......... | 345/582 |

OTHER PUBLICATIONS

Richard I. Hartley, "Self-calibration from multiple views with a rotating camera" Computer Vision—ECCV '94 Lecture Notes in Computer Science vol. 800, 1994, pp. 471-478.*

* cited by examiner

*Primary Examiner* — Utpal Shah
(74) *Attorney, Agent, or Firm* — Novak Druce Connolly Bove + Quigg LLP

(57) ABSTRACT

An electronic device and method creates a part coordinate system of a three-dimensional (3D) product model based on dimensional information in a two-dimensional (2D) drawing of the product, determines transformation matrices of the part coordinate system relative to a machine coordinate system of the measuring machine, and automatically adjusts the orientation of the product model in the machine coordinate system, to align the part coordinate system with the machine coordinate system.

18 Claims, 4 Drawing Sheets

ELECTRONIC DEVICE AND METHOD FOR ADJUSTING ORIENTATION OF PRODUCT MODEL IN MACHINE COORDINATE SYSTEM

BACKGROUND

1. Technical Field

Embodiments of the present disclosure relates to three-dimensional (3D) measurement technology, and more particularly, to an electronic device and a method for adjusting the orientations of product models in a machine coordinate system.

2. Description of Related Art

There are two types of coordinate systems in the field of measurement. One type is called the machine coordinate system, and X, Y, and Z axes of the machine coordinate system refer to the limits of motion of a measuring machine. The other type is called the part coordinate system, and X, Y, and Z axes of the part coordinate system relate to the data or features of the product to be measured using a measuring machine. Before the introduction of computer software to coordinate measurements, the products would be physically adjusted to align the axes of the part coordinate system to the machine coordinate system, so that the machine coordinate system and the part coordinate system are really the same. When the adjustment has to be done manually, this is very time-consuming and not very accurate.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
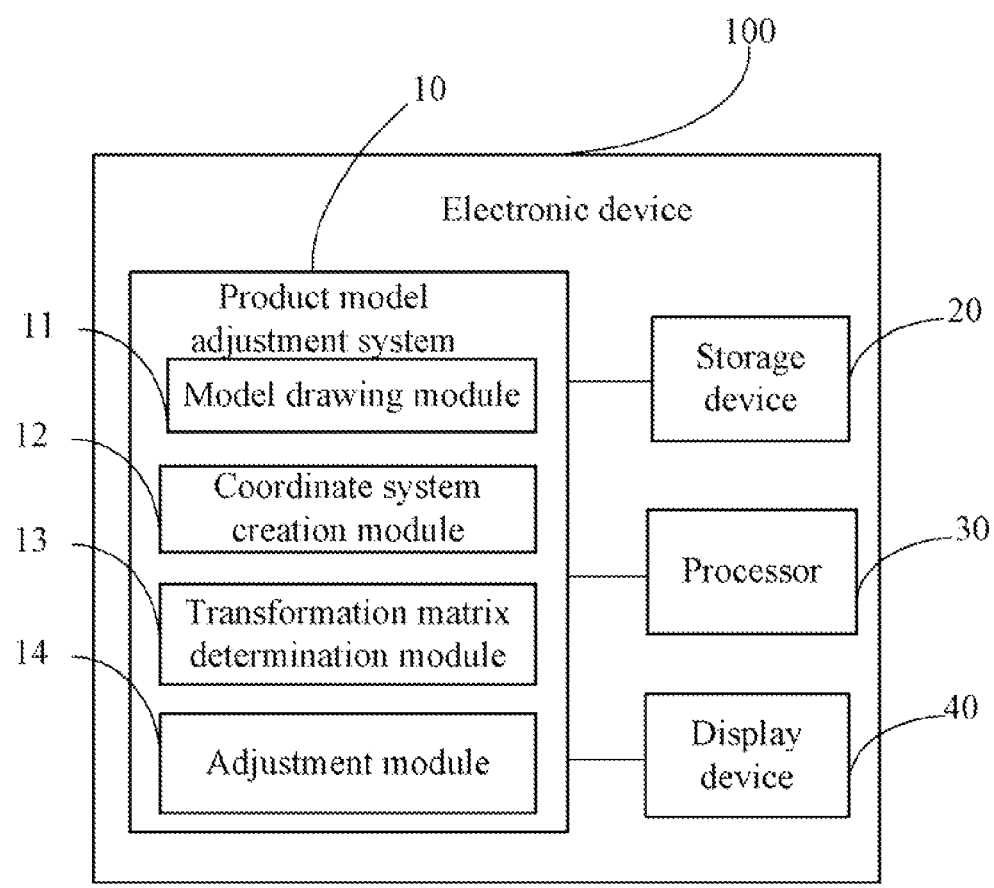
FIG. 1 is a block diagram of one embodiment of an electronic device comprising a product model adjustment system.

FIG. 1 is a block diagram of one embodiment of an electronic device 100 comprising a product model adjustment system 10 (hereinafter, the system 10). In one embodiment, the electronic device 100 further includes a storage device 20, a processor 30, and a display device 40. The storage device 20 stores a three-dimensional (3D) computerized model of a product (hereinafter, the product model), a two-dimensional (2D) computerized drawing of the product, and other product model information. The electronic device 100 may be a computer, or any other electronic device having data processing functions, and may further be connected to a measuring machine that can measure the size and shape of the product.

In one embodiment, the system 10 creates a part coordinate system of the product model based on dimensional information in the 2D drawing of the product, determines any transformation matrices of the part coordinate system relative to a machine coordinate system of the measuring machine, and automatically adjusts the orientation of the product model in the machine coordinate system, to align the part coordinate system of the product model with the machine coordinate system. The display device 40 displays the product model, the 2D drawing, the part coordinate system, the machine coordinate system, and the adjustment process. It is noted that the X, Y, and Z axes of the machine coordinate system refer to the motions of the measuring machine in measuring the product, and the X, Y, and Z axes of the part coordinate system relate to the features of the product to be measured using the measuring machine.

As shown in FIG. 1, the system 10 includes a model drawing module 11, a coordinate system creation module 12, a transformation matrix determination module 13, and an adjustment module 14. The modules 11-14 may comprise computerized code in the form of one or more programs (computer-readable program code) that are stored in the storage device 20. The computerized code includes instructions that are executed by the processor 30 to provide the below-described functions of the modules 11-14 illustrated in FIG. 2. The storage system 20 may be a cache or an independent or a dedicated memory.

Figure 2:
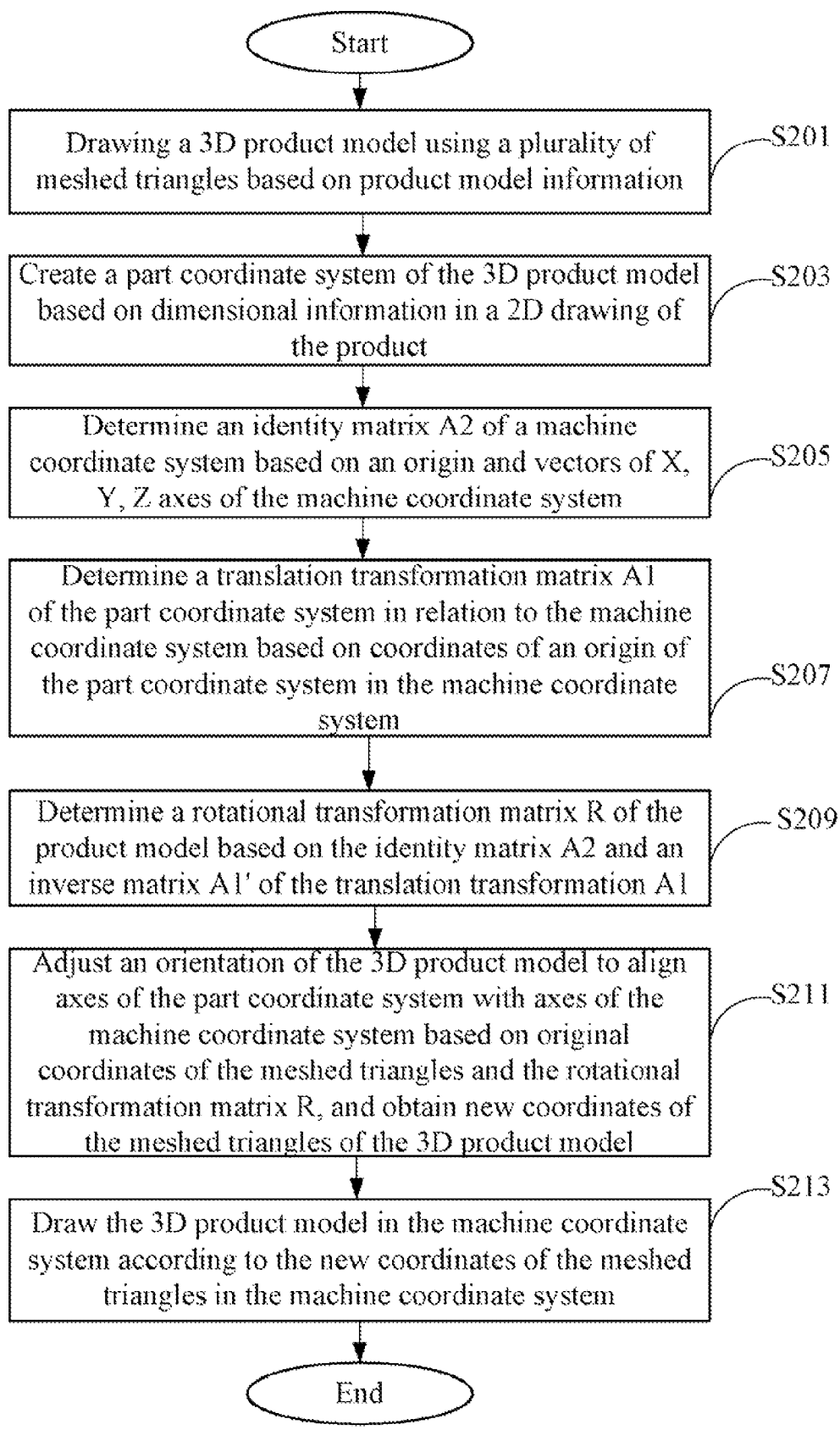
FIG. 2 is a flowchart of one embodiment of a method for adjusting an orientation of a product model in a machine coordinate system.

FIG. 2 is a flowchart of one embodiment of a method for adjusting the product model in the machine coordinate system. Depending on the embodiment, additional blocks may be added, others removed, and the ordering of the blocks may be changed.

In block S201, the model drawing module 11 reads the product model information from the storage device 20, and draws the product model using a plurality of meshed triangles based on the product model information. In one embodiment, the product model information may include a parametric equation (i.e. $x=j(u, v)$, $y=\psi(u,v)$, $0<u,v<=1$) of the product model and the meshing information of the product model. The meshing information includes original coordinates of the vertices of each triangle on the product model. Vertices of each meshed triangle on the product model may be expressed by the 3D coordinates x, y, and z, or may be expressed by the 2D parameters u and v.

Figure 3:
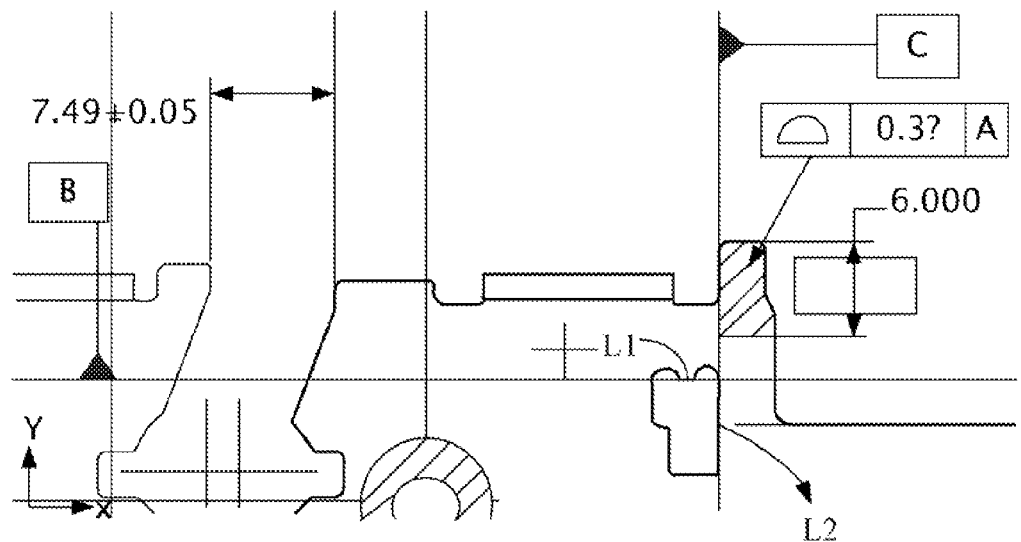
FIG. 3 is an example illustrating dimensional information in a two-dimensional drawing of a product.
Figure 4:
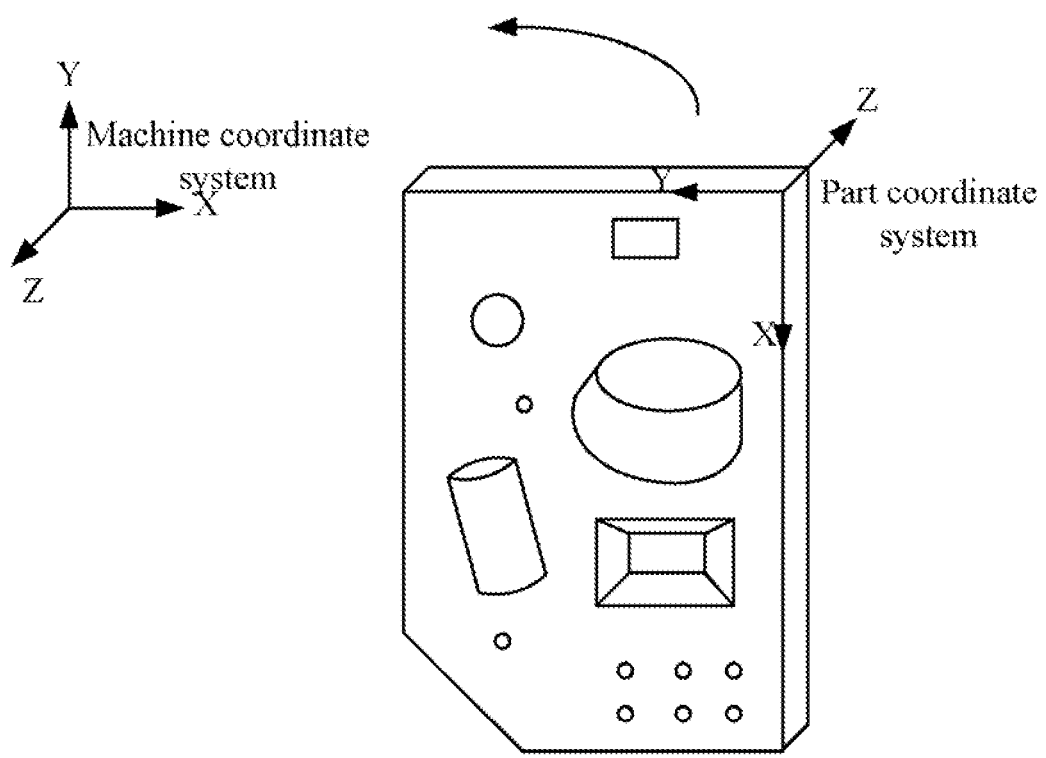
FIG. 4 illustrates examples of a machine coordinate system and a part coordinate system applied to a product model.

In block S203, the coordinate system creation module 12 creates a part coordinate system of the product model based on the dimensional information in the 2D drawing of the product. The dimensional information includes reference points, reference lines, and reference surfaces for measuring the dimensions of the product. For example, the coordinate system creation module 12 may select two perpendicular reference lines, such as the reference lines L1 and L2 in FIG. 3, as the X and Y axes of the part coordinate system, and take an intersection point of those two perpendicular reference lines as an origin of the part coordination system. The coordinate system creation module 12 further takes a normal vector of a reference surface as determined by the two perpendicular reference lines, such as the reference surface A determined by the reference lines L1 and L2 in FIG. 3, as the Z axis of the part coordinate system. Moreover, the coordinate system creation module 12 may determine a corresponding surface on the product model that matches the reference surface, and may generate the part coordinate system for the product model based on the determined X, Y, Z axes, the origin, and the corresponding surface (as shown in FIG. 4).

In block S205, the transformation matrix determination module 13 determines an identity matrix A2 of the machine coordinate system based on an origin and the vectors of the X, Y, Z axes of the machine coordinate system. For example, if the coordinates of the origin of the machine coordinate system is (0, 0, 0), the vector of the X-axis is (1, 0, 0), the vector of the Y-axis is (0, 1, 0), and the vector of the Z-axis is (0, 0, 1), then the identity matrix A2 will be:

$$A2 = \begin{bmatrix} 1 & 0 & 0 & 0 \\ 0 & 1 & 0 & 0 \\ 0 & 0 & 1 & 0 \\ 0 & 0 & 0 & 1 \end{bmatrix}.$$

In block S207, the transformation matrix determination module 13 determines a translation transformation matrix A1 of the part coordinate system relative to the machine coordinate system, based on the coordinates of the origin of the part coordinate system in relation to the machine coordinate system. For example, if the coordinates of the origin of the part coordinate system in the machine coordinate system is (1, 1, 1), then the translation transformation matrix A1 will be:

$$A1 = \begin{bmatrix} 1 & 0 & 0 & 1-0 \\ 0 & 1 & 0 & 1-0 \\ 0 & 0 & 1 & 1-0 \\ 0 & 0 & 0 & 1 \end{bmatrix}.$$

an inverse matrix A1' of the translation transformation matrix A1 will be:

$$A1' = \begin{bmatrix} 1 & 0 & 0 & -1 \\ 0 & 1 & 0 & -1 \\ 0 & 0 & 1 & -1 \\ 0 & 0 & 0 & 1 \end{bmatrix}.$$

In block S209, the transformation matrix determination module 13 determines a rotational transformation matrix R of the product model based on the identity matrix A2 and the inverse matrix A1' of the translation transformation A1. For example, the rotational transformation matrix R is as follows:

$$R = A2 \times A1' = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \times \begin{bmatrix} 1 & 0 & 0 & -1 \\ 0 & 1 & 0 & -1 \\ 0 & 0 & 1 & -1 \\ 0 & 0 & 0 & 1 \end{bmatrix}.$$

In block S211, the adjustment module 14 automatically adjusts the orientation of the product model, to align the axes of the part coordinate system with the axes of the machine coordinate system, so as to bring the two coordinate systems into line with, or to at least be parallel to each other, based on the original coordinates of the vertices of the meshed triangles of the product model and the rotational transformation matrix R. The adjustment module 14 further obtains new coordinates of the vertices of the meshed triangles of the product model as adjusted for the machine coordinate system. It is understood that, the original coordinates of each meshed triangle of the product model multiplied the rotational transformation matrix R equal the new coordinates of the meshed triangle.

In block S213, the model drawing module 11 draws the product model according to the new coordinates of the meshed triangles in the machine coordinate system.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method being executed by a processor of an electronic device for adjusting an orientation of a three-dimensional (3D) product model in a machine coordinate system, the method comprising:
   reading information of the 3D product model from a storage device, the information comprising original coordinates of vertices of a plurality of meshed triangles;
   creating a part coordinate system of the 3D product model based on dimensional information in a two-dimensional (2D) drawing of a product stored in the storage device;
   determining an identity matrix A2 of the machine coordinate system based on an origin of the machine coordinate system and vectors of X, Y, Z axes of the machine coordinate system;
   determining a translation transformation matrix A1 of the part coordinate system in relation to the machine coordinate system based on coordinates of the origin of the part coordinate system in the machine coordinate system;
   determining a rotational transformation matrix R of the 3D product model based on the identity matrix A2 and an inverse matrix A1' of the translation transformation A1; and
   automatically adjusting the orientation of the 3D product model such that axes of the part coordinate system are aligned with the axes of the machine coordinate system based on the original coordinates of vertices of the meshed triangles of the 3D product model and the rotational transformation matrix R.

2. The method of claim 1, after reading information of the 3D product model, further comprising:
   drawing the 3D product model using the plurality of meshed triangles in the machine coordinate system based on the read information.

3. The method of claim 1, further comprising:
   obtaining new coordinates of the vertices of the triangles of the adjusted 3D product model in the machine coordinate system via multiplying original coordinates of vertices of the triangles of the 3D product model by the rotational transformation matrix R; and
   drawing the 3D product model according to the new coordinates of the triangles in the machine coordinate system.

4. The method of claim 1, wherein the dimensional information in the 2D drawing of the product comprises reference points, reference lines, and reference surfaces of dimensions of the product.

5. The method of claim 4, wherein creating the part coordinate system of the 3D product model comprises:
   selecting two perpendicular reference lines as the X, Y axes of the part coordinate system;
   taking an intersection point of the two perpendicular reference lines as an origin of the part coordination system;

taking a normal vector of a reference surface determined by the two perpendicular reference lines as the Z axis of the part coordinate system;

determining a corresponding surface on the 3D product model that matches the reference surface; and generating the part coordinate system on the 3D product model based on the determined X, Y, Z axes, the origin, and the corresponding surface.

6. The method of claim 1, wherein the X, Y, and Z axes of the machine coordinate system refer to motions of a measuring machine for measuring the product, and the X, Y, and Z axes of the part coordinate system relate to features of the product to be measured using the measuring machine.

7. A non-transitory storage medium storing a set of instructions, the set of instructions capable of being executed by a processor of an electronic device to perform a method for adjusting an orientation of a three-dimensional (3D) product model in a machine coordinate system, the method comprising:

reading information of the 3D product model from a storage device, the information comprising original coordinates of vertices of a plurality of meshed triangles;

creating a part coordinate system of the 3D product model based on dimensional information in a two-dimensional (2D) drawing of a product stored in the storage device;

determining an identity matrix A2 of the machine coordinate system based on an origin of the machine coordinate system and vectors of X, Y, Z axes of the machine coordinate system;

determining a translation transformation matrix A1 of the part coordinate system in relation to the machine coordinate system based on coordinates of the origin of the part coordinate system in the machine coordinate system;

determining a rotational transformation matrix R of the 3D product model based on the identity matrix A2 and an inverse matrix A1' of the translation transformation A1; and automatically adjusting the orientation of the 3D product model such that axes of the part coordinate system are aligned with the axes of the machine coordinate system based on the original coordinates of vertices of the meshed triangles of the 3D product model and the rotational transformation matrix R.

8. The non-transitory storage medium of claim 7, wherein after the reading information of the 3D product model the method further comprises:

drawing the 3D product model using the plurality of meshed triangles in the machine coordinate system based on the read information.

9. The non-transitory storage medium of claim 7, wherein the method further comprises:

obtaining new coordinates of the vertices of the triangles of the 3D product model in the machine coordinate system via multiplying original coordinates of vertices of the triangles of the 3D product model by the rotational transformation matrix R; and drawing the 3D product model according to the new coordinates of the meshed triangles in the machine coordinate system.

10. The non-transitory storage medium of claim 7, wherein the dimensional information in the 2D drawing of the product comprises reference points, reference lines, and reference surfaces of dimensions of the product.

11. The non-transitory storage medium of claim 10, wherein creating the part coordinate system of the 3D product model comprises:

selecting two perpendicular reference lines as the X, Y axes of the part coordinate system;

taking an intersection point of the two perpendicular reference lines as an origin of the part coordination system;

taking a normal vector of a reference surface determined by the two perpendicular reference lines as the Z axis of the part coordinate system;

determining a corresponding surface on the 3D product model that matches the reference surface; and generating the part coordinate system on the 3D product model based on the determined X, Y, Z axes, the origin, and the corresponding surface.

12. The non-transitory storage medium of claim 7, wherein the X, Y, and Z axes of the machine coordinate system refer to motions of a measuring machine for measuring the product, and X, Y, and Z axes of the part coordinate system relate to features of the product to be measured using the measuring machine.

13. An electronic device, comprising:

a storage device;

at least one processor;

one or more programs that are stored in the storage device and being executed by the at least one processor, the one or more programs comprising instructions:

to read information of a three-dimensional (3D) product model from a storage device, the information comprising original coordinates of vertices of a plurality of meshed triangles;

to create a part coordinate system of the 3D product model based on dimensional information in a two-dimensional (2D) drawing of a product stored in the storage device;

to determine an identity matrix A2 of a machine coordinate system based on an origin of the machine coordinate system and vectors of X, Y, Z axes of the machine coordinate system;

to determine a translation transformation matrix A1 of the part coordinate system in relation to the machine coordinate system based on coordinates of the origin of the part coordinate system in the machine coordinate system;

to determine a rotational transformation matrix R of the 3D product model based on the identity matrix A2 and an inverse matrix A1' of the translation transformation A1; and to adjust the orientation of the 3D product model such that axes of the part coordinate system are aligned with the axes of the machine coordinate system based on the original coordinates of vertices of the meshed triangles of the 3D product model and the rotational transformation matrix R.

14. The electronic device of claim 13, wherein the one or more programs further comprise instructions:

to draw the 3D product model using the plurality of meshed triangles in the machine coordinate system based on the read information.

15. The electronic device of claim 13, wherein the one or more programs further comprise instructions:

to obtain new coordinates of the vertices of the triangles of the 3D product model in the machine coordinate system via multiplying original coordinates of vertices of the triangles of the 3D product model by the rotational transformation matrix R; and to draw the adjusted 3D product model according to the new coordinates of the triangles in the machine coordinate system.

16. The electronic device of claim 13, wherein the dimensional information in the 2D drawing of the product comprises reference points, reference lines, and reference surfaces of dimensions of the product.

17. The electronic device of claim 16, wherein the instructions to create the part coordinate system of the 3D product model comprises instructions:
- to select two perpendicular reference lines as the X, Y axes of the part coordinate system;
- to take an intersection point of the two perpendicular reference lines as an origin of the part coordination system;
- to take a normal vector of a reference surface determined by the two perpendicular reference lines as the Z axis of the part coordinate system;
- to determine a corresponding surface on the 3D product model that matches the reference surface; and
- to generate the part coordinate system on the 3D product model based on the determined X, Y, Z axes, the origin, and the corresponding surface.

18. The electronic device of claim 13, wherein the X, Y, and Z axes of the machine coordinate system refer to motions of a measuring machine for measuring the product, and X, Y, and Z axes of the part coordinate system relate to features of the product to be measured using the measuring machine.

* * * * *